United States Patent
Greiser et al.

(10) Patent No.: US 8,185,188 B2
(45) Date of Patent: May 22, 2012

(54) METHOD AND APPARATUS FOR MAGNETIC RESONANCE IMAGING ON THE BASIS OF A GRADIENT ECHO SEQUENCE

(75) Inventors: Andreas Greiser, Erlangen (DE);
Carmel Hayes, München (DE);
Wilfried Landschütz, Baiersdorf (DE);
Peter Speier, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 738 days.

(21) Appl. No.: 11/588,710

(22) Filed: Oct. 26, 2006

(65) Prior Publication Data
US 2007/0106150 A1   May 10, 2007

(30) Foreign Application Priority Data
Oct. 26, 2005 (DE) .................. 10 2005 051 323

(51) Int. Cl.
*A61B 5/055* (2006.01)
(52) U.S. Cl. ........ 600/428; 600/407; 600/410; 600/413; 600/425
(58) Field of Classification Search ............ 600/410, 600/411, 413–415, 424–428
See application file for complete search history.

(56) References Cited

U.S. PATENT DOCUMENTS

| | | | |
|---|---|---|---|
| 4,779,620 A * | 10/1988 | Zimmermann et al. | 600/410 |
| 5,251,628 A | 10/1993 | Foo | |
| 5,474,067 A * | 12/1995 | Laub | 600/413 |
| 6,144,201 A | 11/2000 | Miyazaki | |
| 6,888,349 B2 * | 5/2005 | Fautz | 324/309 |
| 6,889,071 B2 | 5/2005 | Saranathan et al. | |
| 6,892,089 B1 * | 5/2005 | Prince et al. | 600/410 |
| 7,403,810 B2 * | 7/2008 | Li et al. | 600/419 |
| 2005/0207538 A1 * | 9/2005 | Mollus et al. | 378/132 |
| 2005/0245812 A1 | 11/2005 | Kim et al. | |
| 2005/0261574 A1 * | 11/2005 | Li et al. | 600/420 |
| 2007/0083106 A1 * | 4/2007 | Sprung | 600/413 |

FOREIGN PATENT DOCUMENTS
WO   WO 2005/023107   3/2005

OTHER PUBLICATIONS

"Motion-Corrected Free-Breathing Delayed Enhancement Imaging of Myocardial Infarction," Kellman et al., Magnetic Resonance in Medicine, vol. 53 (2005), pp. 194-200.

* cited by examiner

*Primary Examiner* — Tse Chen
*Assistant Examiner* — Mark Remaly
(74) *Attorney, Agent, or Firm* — Schiff Hardin LLP (57) ABSTRACT

In a method and apparatus for magnetic resonance imaging on the basis of a gradient echo sequence by excitation of nuclear spins and measurement of radio-frequency signals indicating the excited nuclear spins, a) the pulse frequency of the person to be examined is determined, b) the magnetization of the spins is prepared by means of an RF pulse block, c) a number of steps of the spin excitation as well as measurement of an RF response signal are implemented, with the measurement data along a trajectory established by projection gradients being acquired along a first slice established by a slice-selection gradient, d) items b) through c) are repeated multiple times for the first slice, with each repetition of the steps b) through c) ensuing within a time interval that is fixed in duration, and the interval is temporally displaced relative to the determined pulse frequency for at least one portion of the repetitions, and e) items b) through d) are repeated for various slices.

18 Claims, 6 Drawing Sheets

METHOD AND APPARATUS FOR MAGNETIC RESONANCE IMAGING ON THE BASIS OF A GRADIENT ECHO SEQUENCE

BACKGROUND OF THE INVENTION

1. Field of the Invention

The present invention generally concerns magnetic resonance tomography (MRT) as used in medicine for the examination of patients. The present invention in particular concerns a magnetic resonance tomography apparatus as well as a method for operation of such an magnetic resonance tomography apparatus, with which a high contrast (i.e. a contrast for representation of the blood circulation state of the heart wall) can be achieved in the imaging of various heart phases on the basis of a gradient echo sequence.

2. Description of the Prior Art

MRT is based on the physical phenomenon of magnetic resonance and has been successfully used as an imaging modality for over 15 years in medicine and biophysics. In this examination modality, the subject is exposed to a strong, constant magnetic field. The nuclear spins of the atoms in the subject, which were previously randomly oriented, thereby align. Radio-frequency energy can now excite these "ordered" nuclear spins to a specific oscillation. In MRT, this oscillation generates the actual measurement signal, which is acquired by suitable reception coils. By the use of inhomogeneous magnetic fields generated by gradient coils, the measurement subject can be spatially coded in all three spatial directions. The method allows a free selection of the slice to be imaged. Slice images of the human body thus can be acquired in all directions. MRT as a tomographic modality in medical diagnostics is distinguished predominantly as a "non-invasive" examination method with a versatile contrast possibility. Due to the excellent representation capability of the soft tissue, MRT has developed into a method superior in many ways to x-ray computed tomography (CT). MRT today is based on the application of spin echo and gradient echo sequences that enable an excellent image quality with measurement times in the range of seconds to minutes.

The continuous technical development of the components of MRT amplitude-phase set and the introduction of faster imaging sequences have made more fields available for the use of MRT in medicine. Real-time imaging for supporting minimally-invasive surgery, functional imaging in neurology and perfusion measurement in cardiology are only a few examples.

The acquisition of the data in MRT occurs in k-space (frequency domain). The k-space trajectory determines the sampling, i.e. the order of the data acquisition in k-space. The MRT image in the image domain is linked with the MRT data in k-space via a Fourier transformation. The spatial coding of the subject which spans k-space can ensue in various ways, but a Cartesian or a radial (per-projection) sampling are most conventional. The coding ensues by means of gradients in all three spatial directions. Given Cartesian sampling, a differentiation is made between the slice selection (establishes an acquisition slice in the subject, for example the z-axis), the frequency coding (establishes a direction in the slice, for example the x-axis) and the phase coding (establishes the second dimension within the slice, typically the y-axis). Depending on the combination or interleaving (nesting) of the three gradients in an imaging sequence, the sampling of k-space can ensue in a Cartesian manner (line-by-line) or radially or helically.

In order to measure a slice of the subject to be examined in a Cartesian manner, an imaging sequence is repeated N times for various values of the phase coding gradient (for example $G_y$ is repeated). The frequency of the magnetic resonance signal is sampled, digitized and stored N times at equidistant time intervals $\Delta t$ in each sequence pass via a $\Delta t$-clocked ADC (analog-digital converter) in the presence of the readout gradient $G_x$. In this manner a number matrix (matrix in k-space or k-matrix) is generated line-by-line with N×N data points (a symmetrical matrix with N×N points is only one example; asymmetrical matrixes can also be generated). An MR image of the slice in question with a resolution of N×N pixels can be directly reconstructed from this data set via a Fourier transformation.

Figure 7:
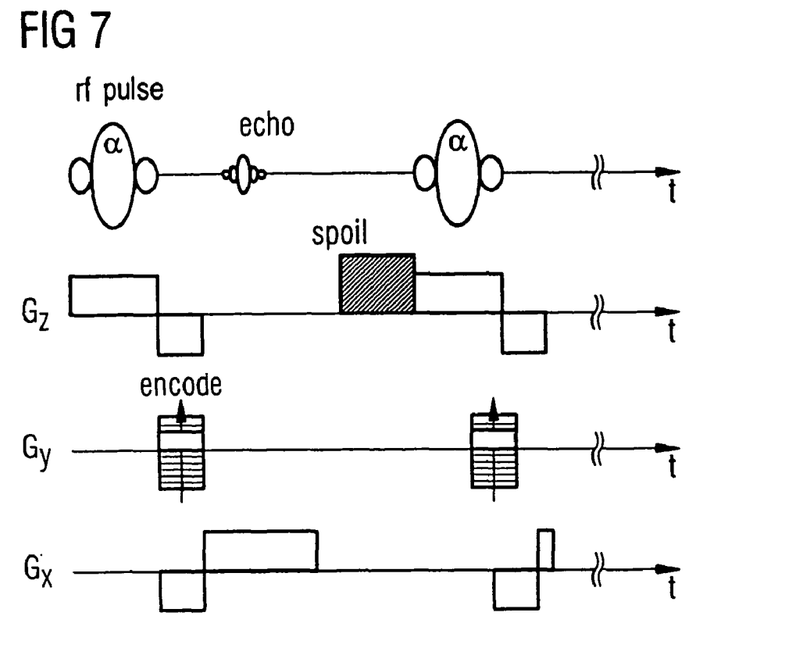
FIG. 7 schematically shows the progression of the FLASH sequence.

FIG. 7 schematically shows the excitation and gradient scheme of the known FLASH (fast low angle shot) sequence. This is based on the principle of the gradient echo technique. Fast image sequences that are based on the principle of the small angle excitation and in which the echo signal is generated exclusively via gradient reversal are designated as gradient echo sequences (GE sequences). Given the small angle excitation, flip angles of $\alpha<90°$ are used, with only a small fraction of the longitudinal magnetization being rotated in the transversal plane. The wait for relaxation of the magnetization is thereby shorter, which leads to significant time savings. Furthermore, due to the pole reversal of the slice-selection and frequency coding gradients, the dephasing of the transverse magnetization caused by the two gradients is compensated such that a gradient echo arises. The RF pulse with a small angle excitation at an angle $\alpha$ is shown in FIG. 7 in the first line and the RF (radio-frequency) signal with the gradient echo is subsequently shown on the time axis. The slice-selection gradient $G_z$ is plotted along the time in the second line. As already explained, the slice-selection gradient is superimposed on the homogeneous magnetic field during the RF pulse along the z-axis and the polarity of said slice-selection gradient is subsequently reversed for the purposes of dephasing. In the fourth line the frequency coding gradient $G_x$ is shown along the time axis. For the frequency coding, a gradient field in the x-direction is superimposed on the homogeneous magnetic field after reversing the polarity of the gradient during the acquisition of the RF signal. The phase coding gradient $G_y$ is shown along the time axis in the third line. For phase coding along the y-axis, a constant gradient is activated for a defined time before acquisition of the RF signal and the sequence is repeated $N_y$ times. After the data acquisition the transverse magnetization is dismantled again by spoiler gradients activated after acquisition of the RF signal. The repetition time TR is the time for a sequence pass between two RF pulses.

Figure 8:
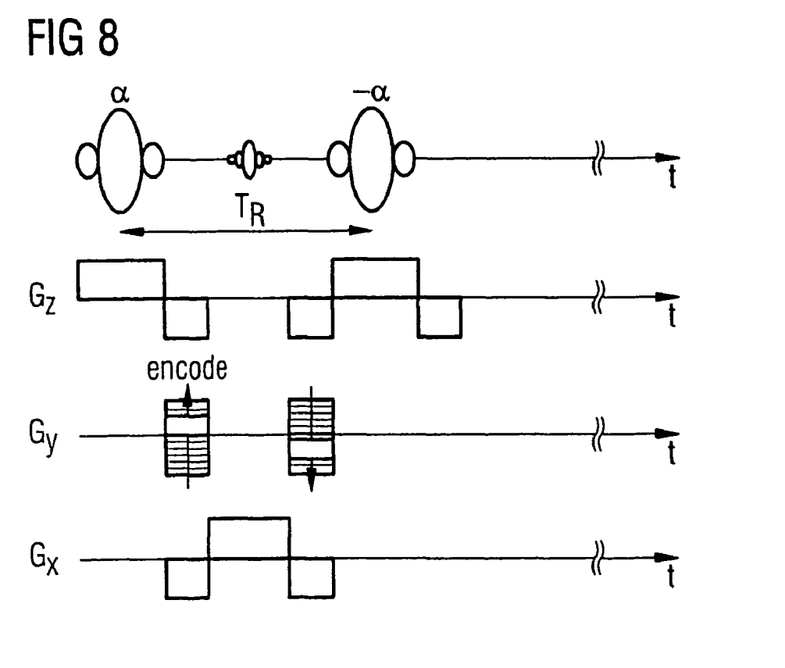
FIG. 8 schematically shows the progression of the True FISP sequence.

FIG. 8 shows the basic principle of the True FISP sequence (fast imaging with steady precision), which is very similar to the FLASH sequence. In contrast to the FLASH sequence, in the True FISP sequence the remaining transversal magnetization is not negated by spoiler gradients after the data readout but rather is completely rephased by switching of gradients in the reversed direction along all three coordinate axes. Due to the rephasing there is a further signal contribution that is available in the subsequent RF excitations.

The exposure of fast image series is by default acquired with the True FISP sequence, since an optimal signal-noise ratio (SNR) can hereby be achieved. The image contrast depends on the ratio of the longitudinal relaxation time $T_1$ to the transversal relaxation time $T_2$. Dependent on the tissue regions to be acquired, the sequence is acquired with $T_1$- or $T_2$-weighted images; for example, $T_1$-weighted image sequences are used for the acquisition of images of the heart or of the heart muscle. $T_1$-weighted image sequences are in particular used to show scars and to show the blood circulation state of tissue. It is disadvantageous, however, that a good $T_1$ contrast requires a long wait time and measurement time since no sufficient longitudinal relaxation has yet occurred directly after the inversion pulse. This problem is counteracted by implementing a magnetization preparation of the tissue before the sequence, the tissue being prepared dependent on $T_1$ and/or $T_2$. The image contrast varies with the interval from the preparation phase; after each preparation phase a data acquisition is therefore possible only within a short time span, which distinctly reduces the quantity of the data that can be acquired. In order to acquire a series of fast images with magnetization preparation, long measurement times are therefore required, or a poor temporal or spatial resolution must be accepted.

The problem of acquiring fast image series of various heart phases and therewith a movie (cine' representation) of the heart movement was previously solved by only a segment of the data necessary for an image being acquired, but this was acquired multiple times, and the segments from various heartbeats were respectively individually associated with a fixed heart phase. This method is disadvantageous in cases where the acquisition time is limited by a breath hold of the person to be examined, since in this case the resolution cannot be improved by decreasing the size of the acquired segments.

SUMMARY OF THE INVENTION

An object of the present invention is to provide a method and an apparatus for MRT imaging in which images with a high resolution and a constant $T_1$ contrast can be acquired for the acquisition of fast image series and movies within a breathing pause.

This object is achieved according to the present invention by a method for magnetic resonance imaging on the basis of a gradient echo sequence by excitation of nuclear spins and acquisition of radio-frequency signals representing the excited nuclear spins, including the following steps:
a) determination of the pulse frequency of the person to be examined,
b) preparation of the magnetization of the spins by means of an RF pulse block,
c) implementation of a plurality of steps of the spin excitation as well as measurement of an RF response signal, whereby the measurement data along a trajectory established by means of projection gradients are acquired along a first slice established by means of a slice-selection gradient,
d) multiple repetition of the steps b) through c) for the first slice, whereby each repetition of the steps b) through c) ensues within a time interval that is fixed in its duration, and whereby the interval is temporally displaced relative to the determined pulse frequency for at least one portion of the repetitions, and
e) repetition of the steps b) through d) for various slices.

The above object also is achieved in accordance with the invention by an apparatus for magnetic resonance imaging on the basis of a gradient echo sequence by excitation of nuclear spins and measurement of radio-frequency signals representing the excited nuclear spins, with: a device for a) determination of the pulse frequency of the person to be examined; a device for b) preparation of the magnetization of the spins by means of an RF pulse block; a device for c) implementation of a number of steps of the spin excitation as well as measurement of an RF response signal, the measurement data along a trajectory established by means of projection gradients being acquired along a first slice established by means of a slice-selection gradient, a device for d) multiple repetition of the steps b) through c) for the first slice, with each repetition of the steps b) through c) ensuing within a time interval that is fixed in its duration, and wherein the interval is temporally displaced relative to the determined pulse frequency for at least one portion of the repetitions; and a device for repetition of the steps b) through d) for various slices.

The interval is temporally displaced for each repetition of the steps b) through c) relative to the determined pulse frequency.

The measurement data are acquired along a slice in N segments in an advantageous manner.

Furthermore, the duration for the acquisition of N segments corresponds in an advantageous manner to the duration between two pulse beats.

In an embodiment, the interval for the repetition of the steps b) and c) is displaced by the duration for the acquisition of a segment, such that the time interval between two preparation pulses corresponds to the duration for the acquisition of N+1 segments.

The acquisition of the measurement data is repeated N times for each slice.

The slice selection can ensue by means of a frequency coding gradient.

The projection coding ensues in an advantageous manner by means of a phase coding gradient and a frequency coding gradient.

The step c) can be implemented according to the True FISP sequence.

The measurement data acquired in k-space are translated into a real image by Fourier transformation.

DESCRIPTION OF THE PREFERRED EMBODIMENTS

Figure 1:
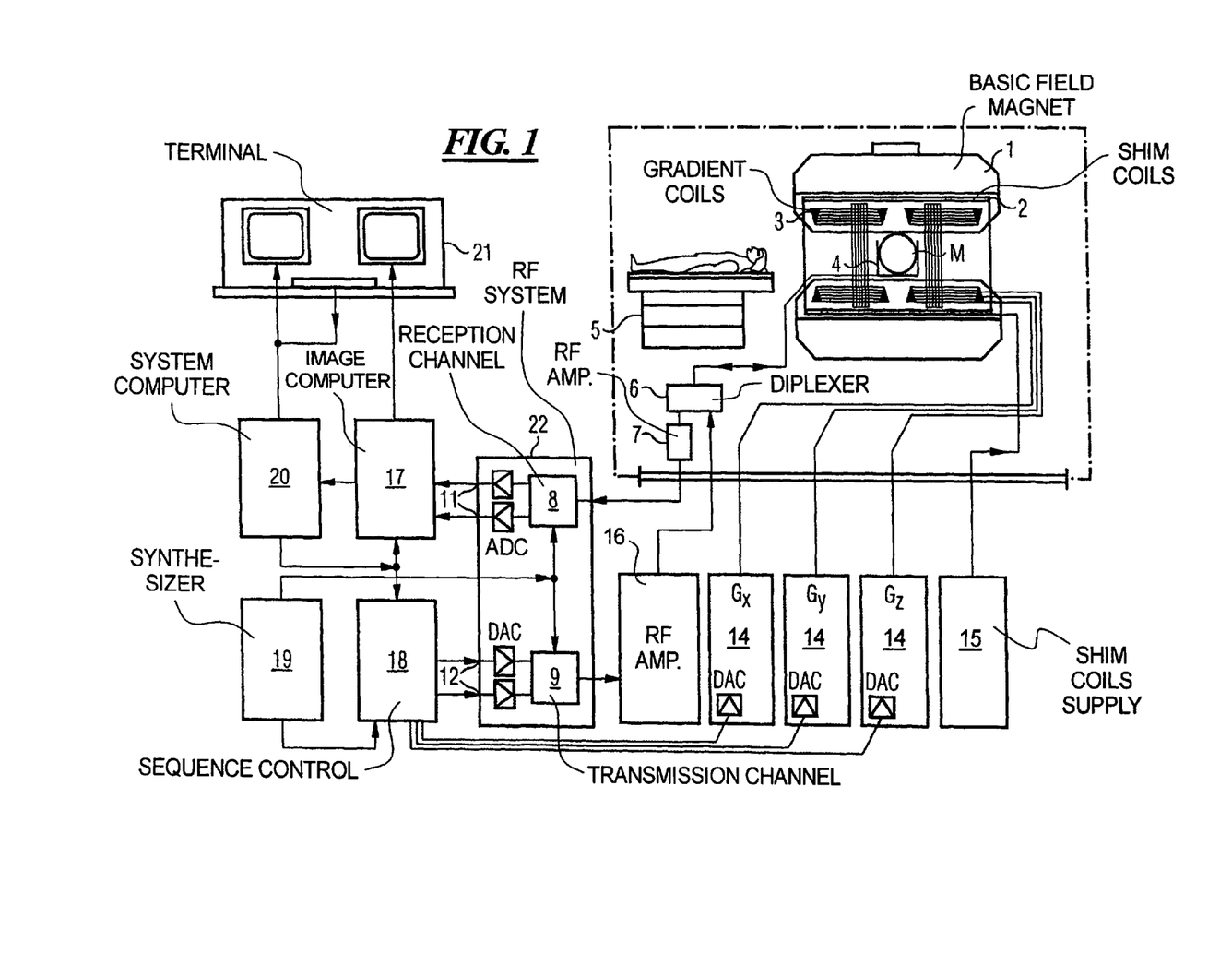
FIG. 1 schematically shows a magnetic resonance tomography apparatus.

FIG. 1 schematically illustrates a magnetic resonance imaging (magnetic resonance tomography apparatus). The design of the magnetic resonance tomography apparatus corresponds to the design of a conventional tomography apparatus, with the differences described below. A basic field magnet 1 generates a temporally-constant strong magnetic field for polarization or alignment of the nuclear spins in the examination region of a subject such as, for example, of a part of a human body to be examined. The high homogeneity of the basic magnetic field necessary for the magnetic resonance measurement is defined in a typically spherical measurement volume M into which the parts of the human body to be examined are introduced. To support the homogeneity requirements, and in particular for elimination of temporally invariable influences, shim plates made from ferromagnetic material are mounted at a suitable location. Temporally-variable influences are eliminated by shim coils 2 that are activated by a shim power supply 15.

A cylindrical gradient coil system 3 that has three sub-windings is used in the basic field magnet 1. Each sub-winding is supplied with current from an amplifier for generation of a linear gradient field in the respective direction of the Cartesian coordinate system. The first sub-coil of the gradient field system 3 generates a gradient $G_x$ in the x-direction, the second sub-coil generates a gradient $G_y$ in the y-direction and the third sub-coil generates a gradient $G_z$ in the z-direction. Each amplifier has a digital-analog converter that is activated by a sequence controller 18 for time-accurate generation of gradient pulses.

Located within the gradient field system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 has one or more RF transmission coils and a number of RF reception coils in the form of an annular, linear or matrix-like arrangement of component coils. The alternating field originating from the precessing nuclear spins (i.e. normally the nuclear spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which are generated the radio-frequency pulses for the excitation of the nuclear spins. The respective radio-frequency pulses are thereby digitally represented in the sequence controller 18 as a series of complex numbers based on a pulse sequence predetermined by the system computer 20. This number series is supplied as a real part and an imaginary part via respective inputs 12 to a digital-analog converter in the radio-frequency system 22 and from this to a transmission channel 9. In the transmission channel 9, the pulse sequences are modulated on a radio-frequency carrier signal having a base frequency that corresponds to the resonance frequency of the nuclear spins in the measurement volume.

The switch-over from transmission made to reception mode ensues via a transmission-reception diplexer 6. The RF transmission coil of the radio-frequency antenna 4 radiates the radio-frequency pulses for excitation of the nuclear spins into the measurement volume M for excitation of the spins and samples resulting echo signals via the RF reception coils. The correspondingly-acquired nuclear magnetic resonance signals are phase-sensitively demodulated on an intermediate frequency in the reception channel 8' (first demodulator) of the radio-frequency system 22 and digitized in the analog-digital converter (ADC). This signal must be demodulated at the frequency 0. The demodulation at frequency 0 and separation into real part and imaginary part occurs after the digitization in the digital domain in a second demodulator 8. An image is reconstructed by an image computer 17 from the measurement data so acquired. The administration of the measurement data, the image data and the control programs ensues via the system computer 20. According to control programs, the sequence controller 18 monitors the generation of the respective desired pulse sequences and the corresponding sampling of k-space. The sequence controller 18 controls the time-accurate switching of the gradients, the emission of the radio-frequency pulses with defined phase and amplitude and the reception of the nuclear magnetic resonance signals.

The time base for the radio-frequency system 22 and the sequence controller 18 is provided by a synthesizer 19. The selection of corresponding control programs for generation of a magnetic resonance image as well as the representation of the generated nuclear magnetic resonance image ensues via a terminal 21 that has a keyboard as well as one or more screens.

Figure 2:
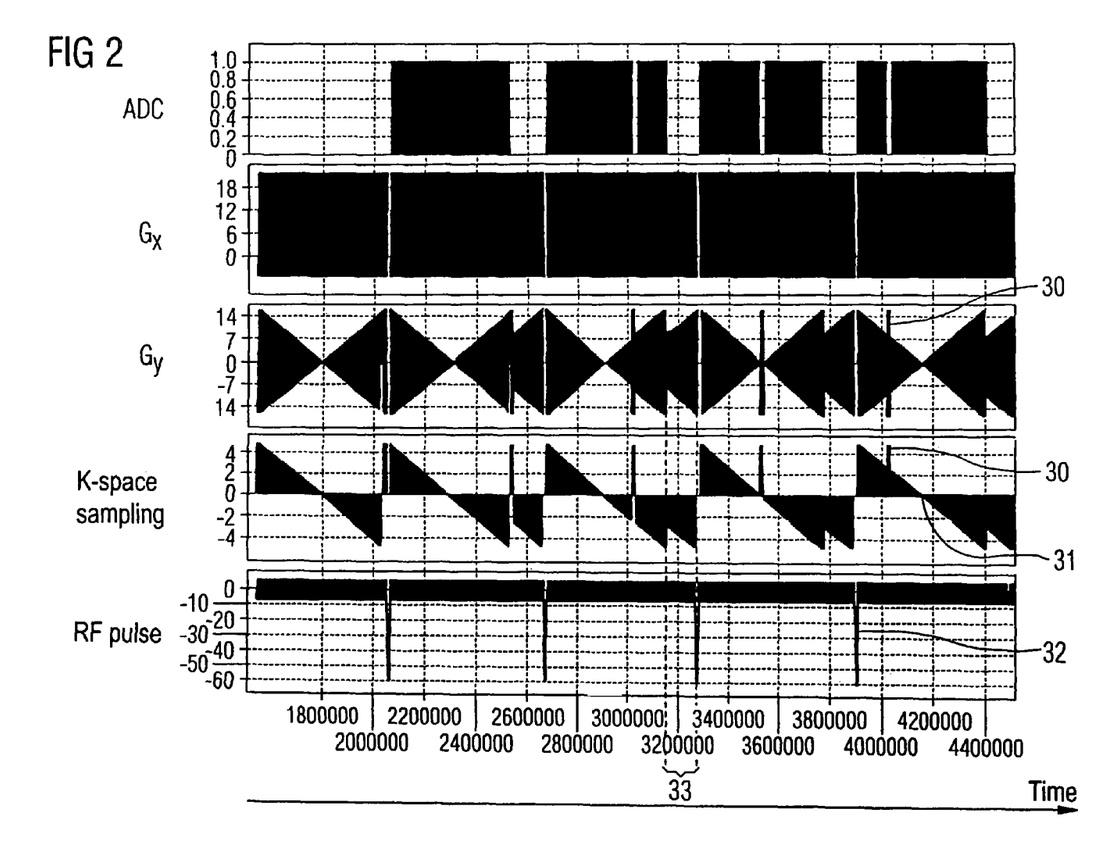
FIG. 2 schematically shows the progression of a portion of the sequence according to the present invention.

FIG. 2 schematically shows the progression of a portion of the sequence according to the present invention. Shown are quantities (varying dependent on the time) that characterize the sequence progression. The progression according to which the ADC 8, 8' is activated or deactivated is shown in the first line, whereby measurement data can be acquired during the phases in which the ADC 8, 8' is activated. The temporal switching sequence of the frequency coding gradient $G_x$ of the gradient coil system 3 is shown in the second line. A line in k-space is successively sampled by means of the frequency coding gradients. The temporal progression of the phase coding gradient $G_y$ of the gradient coil system 3 is shown in the third line. The line or, respectively, a segment comprising multiple lines in k-space is established by the phase coding gradient $G_y$. The k-space sampling is schematically shown in the fourth line. K-space is sampled line-by-line according to the present embodiment. This is represented by means of a linear curve in the line of the k-space sampling; the 0-point passage 31 hereby corresponds to the traversal of the k-space center. The RF pulse 32 generated by means of the antenna 4 for the magnetization preparation is shown in the last line of FIG. 2. A number of RF pulses for spin excitation (not shown) follow between two RF pulses 32 for magnetization preparation, after which a line of k-space or a segment of k-space comprising a plurality of lines is respectively read out. In the present exemplary embodiment, the k-space sampling ensues in four segments. The image contrast is generally dependent on the inner Fourier lines in k-space, whereby the inversion time TI (i.e. the time from radiation of the RF pulse 32 up to the traversal of the k-space center at the 0-point passage 31) must be selected such that the contrast is optimal for the k-space center. As already explained, for this purpose the measurement time must be selected such that, depending on the desired image contrast, the measurement ensues at a specific temporal interval from the RF pulse 32. In the event that the RF pulse respectively ensues simultaneously with a pulse beat (heartbeat) 30 of the person to be examined or is offset by a constant value relative to the pulse beat 30, the image contrast is particularly good for the same heart phase, namely the heart phase during which the center of k-space is traversed; the image contrast is contrarily poorer for the remaining heart phases. According to the present invention another idle phase 33 is interposed after the sampling of k-space, before the next RF pulse 32 is radiated and the next sampling of k-space ensues. The idle phase 33 hereby corresponds in terms of its duration to the duration of the traversal of a segment of k-space. According to the present exemplary embodiment, k-space is sampled in four segments. Due to the additional idle phase 33 the interval between two RF pulses 32 thus corresponds to the duration of the sampling of five segments. Since the duration for the sampling of four segments of k-space precisely corresponds to the duration between two pulse beats 30 of the person to be examined, due to the additional idle phase 33 the RF pulse 32 (and therewith the sampling of k-space in each sequence pass) is displaced by a temporally constant value relative to the pulse beat 30. The sampling of k-space is thus temporally displaced within the heart interval. The point in time of the traversal of the k-space center and thus the point in time for the optimal image contrast are also displaced relative to the heart phases, so images with different contrast are acquired for each heart phase. The parameters for the sequence pass are selected such that a specific k-space segment is always sampled at the same point in time after the RF pulse 32 and this always has the same contrast. A contrast averaging over a large time span can thus ensue with the sequence according to the present invention.

The present invention is not limited to the described exemplary embodiment. Rather, k-space can be sampled in an arbitrary number of segments or also line-by-line. Furthermore, the duration for the idle phase 33 can correspond to the duration of one or more segments. Furthermore, the RF pulse 32 as well as the sampling of k-space can also be irregularly shifted relative to the pulse frequency. This means that no idle phase 33, or idle phases of different lengths, are inserted in specific repetitions.

The RF pulse 32 can be an individual pulse or a different RF pulse block arbitrarily formed by a number of pulses for preparation. More complex combinations are used for $T_1$ or $T_2$ preparation. After each RF pulse block 32 for magnetization preparation, data are acquired along an established trajectory along a first slice established by means of a slice-selection gradient $G_z$, the trajectory being established within the slice by means of projection gradients $G_x$ and $G_y$. As already explained, the individual segments of k-space and therewith the partial data are displaced relative to the determined pulse 30. In order to attain a high time resolution, the partial data from the measurements repeated after the RF pulse block 32 are combined such that each image possesses a high time resolution.

A fast image sequence of spatially and temporally high-resolution images of the heart thus can be created, and moreover in particular a temporally and spatially high-resolution film of the heart movement with good $T_1$ contrast. Although the measurement time is limited by the maximum duration within which the patient can hold his or her breath, according to the present invention it is possible to acquire a temporally and spatially high-resolution movie of the heart movement without additional effort or an extension of the measurement time.

Figure 3:
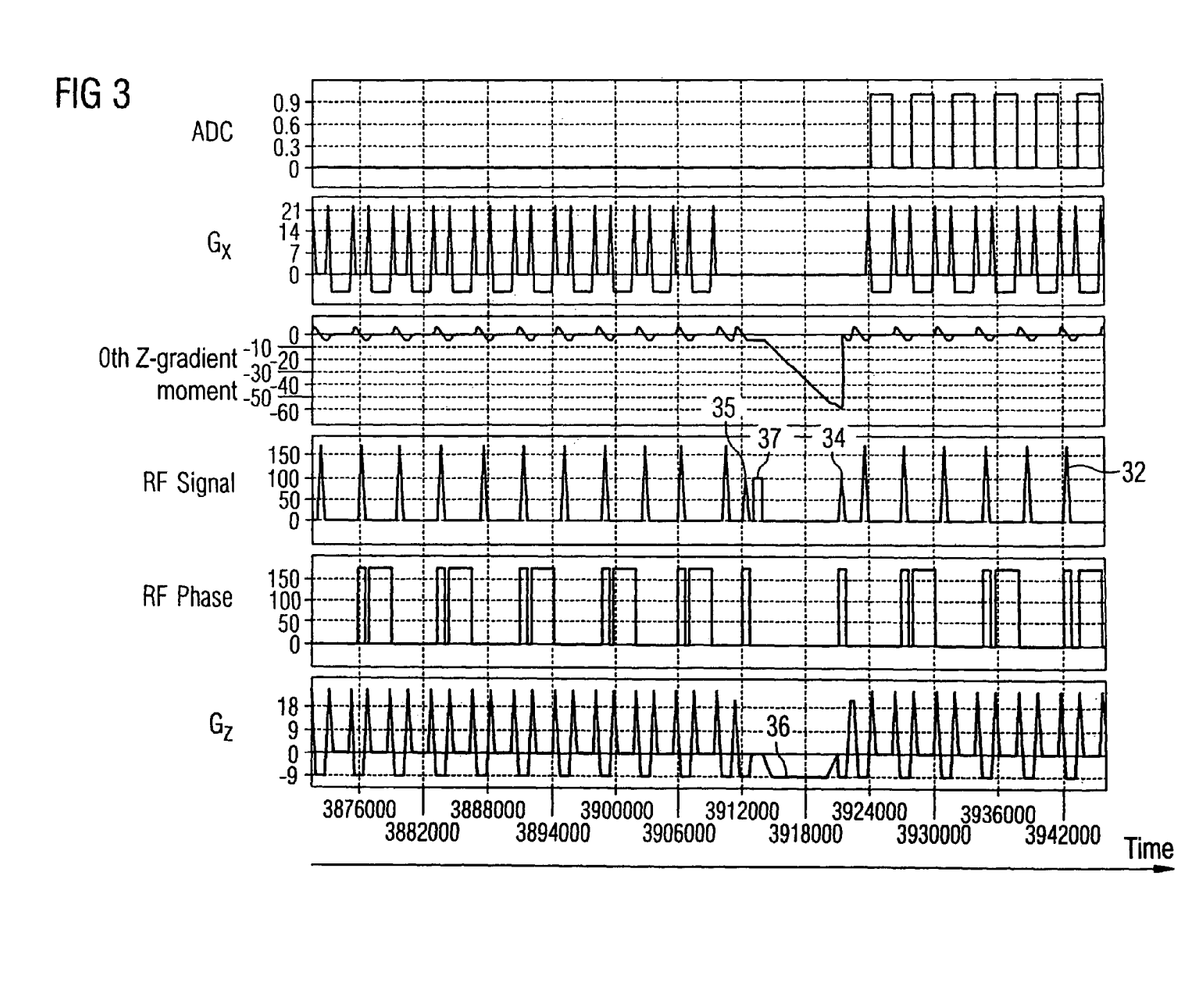
FIG. 3 schematically shows the progression of the sequence according to the present invention.

The progression according the inventive sequence is shown in a second view in FIG. 3. The temporal progression of various quantities (variables) that determine the sequence is shown. The switching sequence of the analog-digital converter 8, 8' is indicated in the first line. The curve of the frequency coding gradient $G_x$ is shown in the second line. The third line shows the z-gradient moment of the 0th order. The sequence of the radio-frequency excitation according to the present invention is shown in the fourth line. The fifth line shows the phase change of the NCO (numerically-controlled oscillator), for generation of periodic signals with a precisely-set frequency. The NCO phase varies between 0° and 180°. The slice-selection gradient $G_z$ is shown in the lowermost line. After passage of the True FISP sequence, the magnetization is approximately located in an equilibrium state. In order to begin from this equilibrium magnetization from the sequence given an inversion pulse, the state of the equilibrium magnetization along the static magnetic field is stored as a polarization via an $\alpha/2$ pulse 35. The inversion pulse or the RF pulse block (which, in the simplest case, is a 90° pulse 37) is subsequently radiated. Following this all remaining transversal magnetization components are erased by a z-gradient spoiler 36. Following this is a second $\alpha/2$ pulse 34 in order to achieve the True FISP steady state (i.e. the equilibrium magnetization) without large signal fluctuations. The acquisition of the measurement data by means of the True FISP sequence follows after the second $\alpha/2$ pulse 34. Other preparation blocks (such as, for example, linear ramps) can also be used instead of $\alpha/2$ pulses.

The measurement data acquired in k-space are translated into a real image by means of Fourier transformation. Only the phase-corrected real part of complex k-space is used in the Fourier transformation. Given saturation-prepared images in which no inverted spins occur, the phase correction can be acquired from the measurement data in the middle of k-space itself under the assumption that no phase jumps exist. In contrast to this, given inversion preparation a separate reference measurement is used in order to be able to detect inverted spins.

Figure 4:
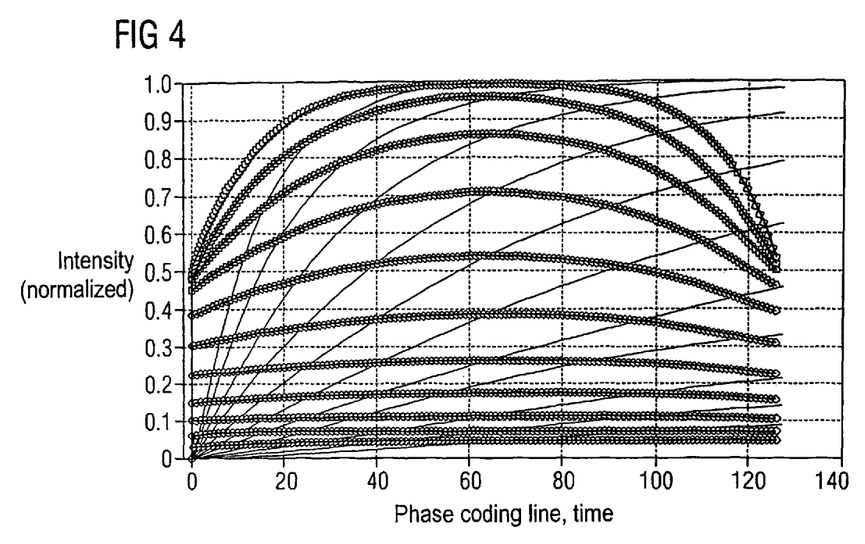
FIG. 4 shows relaxation curves for different $T_1$ times.

Various relaxation curves for different ratios of the longitudinal relaxation time $T_1$ to the acquisition time are shown along the time axis in FIG. 4. The relaxation curves are monotonous and therefore asymmetrical. By default the magnitude of the signal is used for reconstruction of an image given Fourier transformation. Due to the asymmetry of the relaxation curves, this leads to blurring in the obtained image, in particular when the entire relaxation curve is sampled. These artifacts can be avoided in that not the magnitude but rather only the real part of complex k-space is used for reconstruction of the image. This yields a symmetrization of the relaxation curves as shown in FIG. 4 in the dotted graphs. As shown in the example of FIG. 4, average is obtained across all values along the phase coding lines, meaning that, in the case of 128 phase coding lines (as in FIG. 4), starting from the value in the middle phase coding line 64 averaging is respectively performed over the values situated to the right and left of this. As can be seen from FIG. 4, ideal straight lines result for long relaxation times $T_1$, in contrast to which the symmetrized curves for shorter relaxation times exhibit a strong (severe) curvature at the boundary values. This low-pass behavior at the borders of the image does in fact generate certain intensity fluctuations for long $T_1$ values; however, these remain within a tolerable scope since they remain within 5%. The image processing and data evaluation ensue for the most part by means of the image computer 17, the system computer 20 and the terminal 21.

Figure 5:
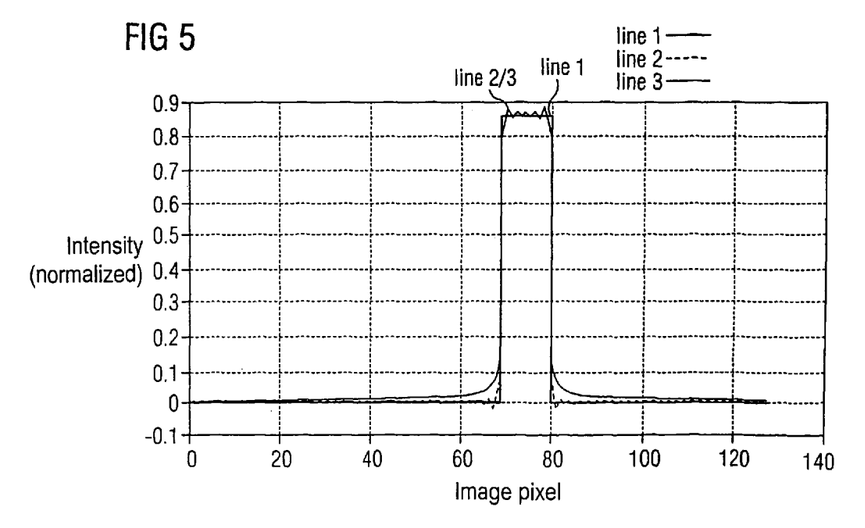
FIG. 5 shows the signal intensity for various methods of image reconstruction.
Figure 6:
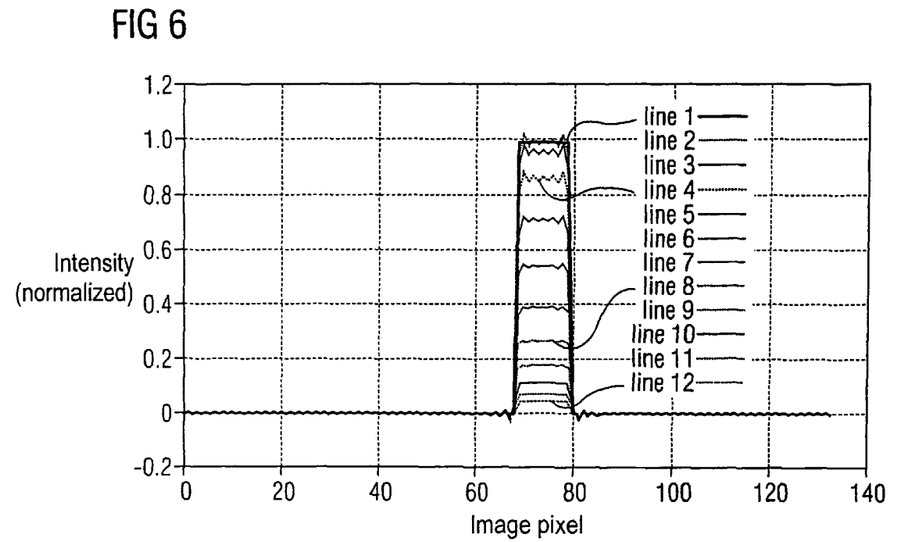
FIG. 6 shows various signal intensities for different relaxation times $T_1$.

FIGS. 5 and 6 show a spatial representation along the phase coding direction, whereby the image pixels are plotted along the x-axis and the intensity of the image signal is plotted along the y-axis. The ideal case of such a curve is designated with the first line in Figure, in contrast to which the curves designated with the second line or the third line respectively show the magnitude portion of an image and the real part of an image. From FIG. 5 it is apparent that the fluctuations of the real part image correspond to that of the magnitude image and that the fluctuations remain within tolerable limits. Furthermore, FIG. 6 shows that the fluctuations decrease with an increasing relaxation time since the intensities are plotted for various relaxation times. The curve designated with the first line is again the reference image; the curves designated with the second line through the twelfth line correspond to the intensities for larger relaxation times.

Although the fluctuations of the intensity lie inside an acceptable tolerance range, they can be compensated by subsequent multiplication of the data in the phase coding direction in that a filter compensates the average fluctuations in the data. In an alternative, the data acquisition is not expanded across the entire relaxation curve. The asymmetry is particularly strong immediately after the preparation pulse, such that a very short wait time after the preparation pulse is sufficient in order to minimize the fluctuations of the intensity.

In a preferred embodiment of the invention a saturation pulse is used as a preparation pulse. The contrast-noise ratio is thereby reduced by half, and the acquisition time is quadrupled given the same signal/noise ratio. Furthermore, no phase reference image must be acquired given the use of a saturation pulse. Moreover, after a sequence pass an equilibrium magnetization does not have to be waited for, whereby the next sequence pass can be begun immediately after the end of the preceding sequence pass. An acquisition time can hereby be achieved that is twice as fast as given use of an inversion pulse.

In an alternative embodiment it is possible to skip over a segment in the acquisition in stead of inserting an idle phase 33 into the sequence, whereby the measurement time is in particular further shortened.

Furthermore, the possibility exists to use an inversion pulse instead of a saturation pulse. Moreover, the FLASH sequence or any other gradient echo sequence can be used for the sequence.

Moreover, a further shortening of the measurement time is possible in that a plurality of inversion pulses are radiated within a pulse beat interval. Times of 200 to 250 msec can hereby be achieved for the inversion time.

In a further embodiment it is possible to radiate the preparation pulse independent of the measured pulse of the person to be examined and, in a later image reconstruction, to sort the measurement data corresponding to the various heart phases.

The present invention makes it possible to use the entire interval between two pulse beats for the acquisition of measurement data and to acquire the measurement data during the entire relaxation. A short measurement time is hereby achieved, which in particular is of great importance in examinations that require a breath hold.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance imaging based on a gradient echo sequence, comprising the steps of:
   (a) determining a cardiac pulse frequency of an examination subject that defines a heart phase of the examination subject;
   (b) preparation of magnetization of nuclear spins in the subject by radiating an RF pulse block, comprising at least two preparation pulses that invert the nuclear spins, into the subject;
   (c) following each preparation pulse, exciting said nuclear spins in the examination subject to cause the nuclei to emit an RF response signal, spatially encoding the subject by emitting magnetic gradients, and emitting a slice-selection gradient and acquiring said RF response signal representing magnetic resonance data and entering said magnetic resonance data into k-space in N segments of k-space that collectively constitute an entirety of a slice established by said slice-selection gradient, each of said segments having a segment duration time that is necessary for entering said magnetic resonance data into that segment;
   (d) repeating steps (b) and (c) N times for said slice, with each repetition ensuing within a repetition time interval having a fixed duration, and temporally shifting a time relative to said heart phase, at which a first of said at least two preparation pulses is radiated, in order to produce a time duration between said first of said at least two preparation pulses and a next successive preparation pulse of said at least two preparation pulses that equals a time duration for acquisition of N+1 segments and thereby causing said magnetic resonance data to be entered at a center of k-space, in each of said repetitions, at a same point in time after each preparation pulse;
   (e) repeating steps (b) through (d) for each of a plurality of additional slices of the subject; and
   (f) from said RF response signals, generating an image of each of said slices.

2. A method as claimed in claim 1 comprising acquiring said N segments in a time equal to a duration between two cardiac pulse beats of the subject.

3. A method as claimed in claim 1 comprising emitting a frequency coding gradient as said slice-selection gradient.

4. A method as claimed in claim 1 comprising emitting a phase coding gradient and a frequency coding gradient as said spatially-encoding gradients.

5. A method as claimed in claim 1 comprising implementing step (c) using a True FISP pulse sequence.

6. A method as claimed in claim 1 comprising entering measurement data corresponding to the acquired RF response signals into k-space and generating said image of each slice in step (e) by converting the data in k-space for each slice into an image by Fourier transformation.

7. A method as claimed in claim 6 comprising imparting a contrast to said RF response signal for each slice, and emitting said idle pulse to set said time duration between said two preparation pulses to cause data in the center of k-space for each slice to be acquired at a time causing said data in the center of k-space to have the same contrast in each slice.

8. A method as claimed in claim 6 wherein each data entry in k-space comprises a real part and a complex part, and comprising subjecting the real part of the entries in k-space to phase-correction, to obtain a phase-corrected real part of k-space, and applying said Fourier transformation only to said phase-corrected real part of k-space.

9. A method as claimed in claim 1 comprising generating a cin éseries from the respective images of each of said slices.

10. An apparatus for magnetic resonance imaging based on a gradient echo sequence, comprising:
   a magnetic resonance scanner configured to interact with a subject, said scanner having an RF radiator and a gradient system;
   a unit adapted to interact with the subject to determine a cardiac pulse frequency of an examination subject that defines a heart phase of the examination subject;
   a control unit configured to operate said scanner to acquire magnetic resonance data from a plurality of slices to (a) prepare magnetization of nuclear spins in the subject by radiating an RF pulse block, comprising at least two preparation pulses that invert the nuclear spins, into the subject from said RF radiator, (b) following each preparation pulse, to excite said nuclear spins in the subject with said RF radiator to cause the nuclei to emit an RF response signal, and to spatially encode the subject by emitting magnetic gradients from said gradient system, and to emit a slice-selection gradient, and to acquire said RF response signal representing magnetic resonance data and entering said magnetic resonance data into k-space in N segments of k-space that collectively constitute an entirety of a slice established by said slice-selection gradient, each of said segments having a segment duration time that is necessary for entering said magnetic resonance data into that segment, and (c) to repeat steps (a) and (b) N times for said slice, with each repetition ensuing within a repetition time interval having a fixed duration, and to temporally shift a time, relative to said heart phase, at which a first of said at least two preparation pulses is radiated, in order to produce a time duration between said first of said at least two preparation pulses and a next successive preparation pulse of said at least two preparation pulses that equals a time duration for acquisition of N+1 segments and thereby causing said magnetic resonance data to be entered at a center of k-space, in each of said repetitions, at a same point in time after each preparation pulse, and to repeat steps (a) through (c) for each of a plurality of additional slices of the subject; and an image computer configured to generate, from said response signals, an image of each of said slices.

11. An apparatus as claimed in claim 10 wherein said control unit operates said scanner to acquire said N segments in a time equal to a duration between two cardiac pulse beats of the subject.

12. An apparatus as claimed in claim 10 wherein said control unit operates said scanner to emit a frequency coding gradient from said gradient system as said slice-selection gradient.

13. An apparatus as claimed in claim 10 wherein said control unit operates said scanner to emit a phase coding gradient and a frequency coding gradient from said gradient system as said spatially-encoding gradients.

14. An apparatus as claimed in claim 10 wherein said control unit operates said scanner to implement (b) using a True FISP pulse sequence.

15. An apparatus as claimed in claim 10 comprising a memory to which said control unit has access, and wherein said control unit enters measurement data corresponding to the acquired RF response signals for each slice into k-space in said memory, and wherein said image computer has access to said memory and is configured to convert the data in k-space into an image by Fourier transformation.

16. An apparatus as claimed in claim 15 wherein said control unit is configured to operate said scanner to impart a contrast to said RF response signal for each slice, and to emit said idle pulse to set said time duration between said two preparation pulses to cause the measured data entered into the center of k-space for each slice to have the same contrast.

17. An apparatus as claimed in claim 15 wherein each data entry in k-space comprises a real part and a complex part, and wherein said image computer is configured to subject the real part of the entries in k-space to phase-correction, to obtain a phase-corrected real part of k-space, and to apply said Fourier transformation only to said phase-corrected real part of k-space.

18. An apparatus as claimed in claim 10 wherein said image computer is configured to generate a ciné series from the respective images of each of said slices.

* * * * *